United States Patent [19]

Suzuki et al.

[11] 4,044,342
[45] Aug. 23, 1977

[54] DYNAMIC TYPE SEMICONDUCTOR MEMORY DEVICE

[75] Inventors: Yasoji Suzuki, Ayase; Kiyofumi Ochii, Yokohama, both of Japan

[73] Assignee: Tokyo Shibaura Electric Co., Ltd., Tokyo, Japan

[21] Appl. No.: 679,177

[22] Filed: Apr. 22, 1976

[30] Foreign Application Priority Data

Apr. 22, 1975 Japan ............................ 50-48953

[51] Int. Cl.² .............................................. G11C 11/40
[52] U.S. Cl. ...................... 340/173 DR; 340/173 CA; 340/173 FF; 307/238
[58] Field of Search ..... 340/173 R, 173 FF, 173 CA, 340/173 DR; 307/238, 279

[56] References Cited

U.S. PATENT DOCUMENTS 3,955,181  5/1976  Raymond ................... 340/173 DR

Primary Examiner—Terrell W. Fears
Attorney, Agent, or Firm—Finnegan, Henderson, Farabow & Garrett

[57] ABSTRACT

The dynamic type semiconductor memory device comprises a refresh circuit and a plurality of memory cells which are connected between a data input line and a data output line, a plurality of read/write command signal lines and a plurality of word selection lines provided for respective semiconductor memory cells. Each semiconductor memory cell comprises serially connected first p-channel MOS transistor and a second n-channel MOS transistor having gate electrodes connected to the read/write command signal line and the data input line respectively, a third p-channel MOS transistor connected between the data output line and the word selection line and having a gate electrode connected to the node between the first and second transistors, and a parasitic capacitance connected to the node between the first and second transistors for storing data.

13 Claims, 10 Drawing Figures

DYNAMIC TYPE SEMICONDUCTOR MEMORY DEVICE

This invention relates to a semiconductor memory device, more particularly a dynamic type semiconductor memory device.

With recent development regarding integrated circuits, memory devices utilizing the same principle as flip-flop circuits have been developed comparable in cost with other type of conventional memory devices, such as magnetic memory devices. Logical operation circuits have firstly been constructed as integrated circuits for use in electronic computers and in recent years it became possible to construct memory devices as large scale integrated circuits. The reduction in cost and the improvement of the characteristics of such memory devices enable their commercial use. Among present monolithic IC memory devices are included a system consisting essencially of a bipolar transistor which operates under the same principle as an ordinary transistor and a system consisting essentially of a MOS transistor. Generally, the former system is suitable for high speed, small capacity memory devices whereas the latter system is suitable for memory devices having large capacities because it is possible to fabricate them with higher bit densities although the operating speed of the latter system is lower than that of the former system utilizing the bipolar transistors. Furthermore, a memory device utilizing a MOS transistor is advantageous in that it is possible to manufacture it with simple manufacturing steps at less percentage of rejects. Moreover, as it is easy to construct the memory device as an integrated circuit, the cost per unit memory cell can be reduced.

The unit memory cell of a MOS-IC memory device is constituted by a p-channel MOS transistor or an n-channel MOS transistor. However, it has already been known that, in order to form a randum access memory (RAM) which is the most common one among various memory devices, a complementary MOS circuit (C-MOS) in which p- and n-channel MOS transistor circuits are paired is advantageous by the following reasons.

1. That the density of integration is high and the power consumption is small,
2. That high speed operation is possible,
3. That the permissible range of respective parameters of the element is wide,
4. That the noise can be removed readily,
5. That the fan out is large,
6. That it is possible to operate with only one type of source and the operating range is wide. MOS-RAMs can be classified into two types, one the static type and the other the dynamic type.

The static type MOS-RAM is constructed so that a flip-flop circuit is arranged at the center of a memory and that the stored data will not be erased as long as the application of the source voltage is continued. On the other hand, the dynamic type MOS-RAM is constructed to utilize the parasitic capacitance at the gate electrode of a MOS transistor and a transistor associated therewith as a memory element and to store a binary data "1" or "0" depending upon whether charge is accumulated in the parasitic capacitance or not. In the dynamic type MOS-RAM, since the charge stored in the parasitic capacitance is discharged gradually through a leakage path, it is necessary to recharge it in a definite time in order to maintain the data. Accordingly, the so-called refresh circuit is provided for recharging.

Heretobefore most of the complementary MOS-RAMs or so-called CMOS-RAMs are of the static type. As described above, in the static type CMOS-RAM, as it is necessary to always apply an operating potential during its operation, in the case of a large capacity it is impossible to limit the power comsumption to a reasonable low value.

In a typical static type CMOS-RAM, at the time of writing or reading data a DC current path is formed between a data input-output line and a memory cell and the ratio of the mutual conductance $gm$ of a transistor included in the DC current path is utilized to provide a voltage division. For this reason, in order to accurately reproduce the mutual conductance $gm$ of the transistor utilized for voltage division. A high degree of skill is required to manufacture the transistor. Moreover, at the time of writing and reading the data a ratio circuit is formed whereby increase of the power consumption is inevitable thereby decreasing the merit of low power consumption characterizing the complementary MOS circuit.

It is an object of this invention to provide a dynamic type semiconductor memory device having a large memory capacity and a high degree of integration, that consumes a low power and can be manufactured at a high yield.

According to this invention there is provided a dynamic type semiconductor memory device comprising a refresh circuit, a plurality of semiconductor memory cells which are connected across a data input line and a data output line, a plurality of read/write command signal lines and a plurality of word selection lines which are provided for each of said semiconductor memory cells, each of said semiconductor memory cells comprising serially connected first and second transistors of the opposite polarity, the gate electrodes of the first and second memory transistors being connected to the read/write command signal line and the data input line respectively, a third transistor connected across the data output line and the word selection line, the gate electrode of the third transistor being connected to the node between the first and second transistors, and a parasitic capacitance formed at the common juncture between the first, second and third transistors for storing data.

Figure 1:
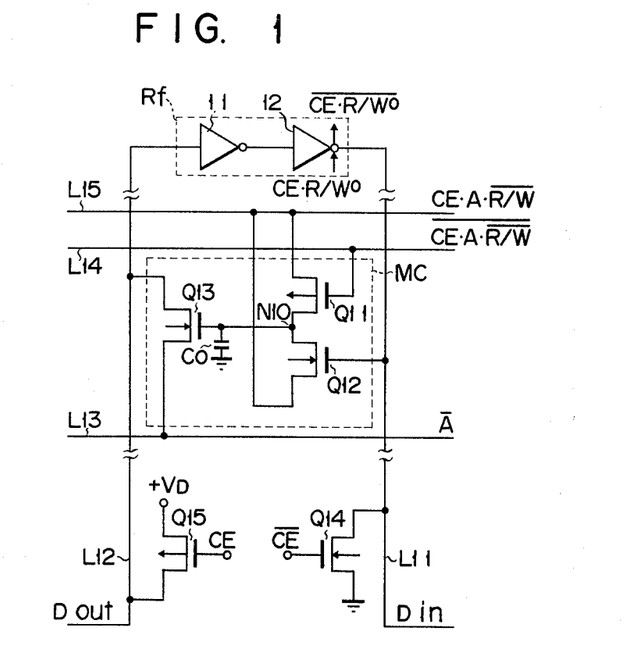
FIG. 1 is a connection diagram of one embodiment of the dynamic type semiconductor memory circuit constructed according to this invention.

In a preferred embodiment shown in FIG. 1, the CMOS memory circuit formed on one chip of a semiconductor wafer is formed with 32 memory cells MC between a data input line L11 and a data output line L12 thus forming 32 pairs of data input-output lines so as to provide a memory capacity of 1024 bits, for example. Thus, in this CMOS memory circuit, one memory cell MC comprises one bit so as to form a memory device having a capacity of 32 × 32 bits. Assuming that one bit constitutes one word, the memory capacity is 1024 words.

Figure 2:
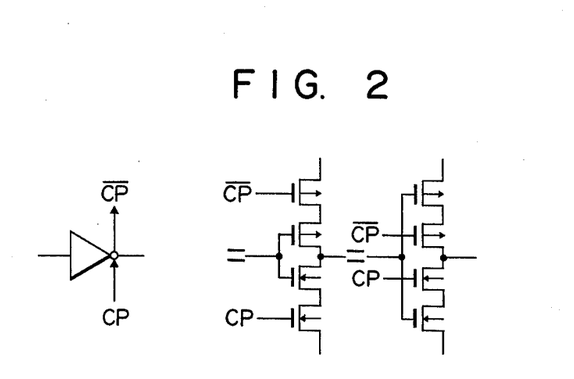
FIG. 2 shows inverter circuits of the refreshing circuit.

More particularly, in the embodiment shown in FIG. 1, across the data input line L11 and the data output line L12 is connected a refresh circuit Rf which amplifiers and feedbacks the data of the data output line L12 in a manner to be described later. The refresh circuit Rf is constituted by two serially connected inverter circuits 11 and 12. The data input line L11 is grounded through the source-drain path of an n-channel MOS transistor Q14, whereas the data output line L12 is connected to a source of positive potential $+V_D$ through the source-drain path of a p-channel MOS transistor Q15. These transistors Q14 and Q15 are actuated by address signals, or chip selection signals $\overline{CE}$ and CE, respectively, thus forming a type of an address gate circuit. One of the inverter circuits or the inverter circuit 12 in the later stage takes the form of a clocked inverter circuit as shown in FIG. 2. The gate electrode of the p-channel type transistor Q15 is supplied with a memory element selection signal, for example, a chip enable signal (hereinafter abbreviated as a CE signal), whereas the gate electrode of the n-channel type transistor Q14 is supplied with an inverted signal $\overline{CE}$ of the CE signal. Word selection signal lines L13 (one line is shown in figure) are provided for respective ones of 1024 bits or words of the memory device for applying thereto a word selection signal $\overline{A}$. Signal lines L14 and L15 are connected to receive a $CE \cdot A \cdot \overline{R/W}$ signal and a $CE \cdot A \ \overline{R/W}$ signal, respectively for applying a read/write command signal R/W to a memory cell specified by a word selection signal and a CE signal. A logical product of a CE signal and read-write control signal $R/W^0$ is used as the clock pulse CP for the clocked inverter circuit 12. In the absence of the clock pulse, the impedance between the input and output lines becomes high.

The p-channel type transistor Q11 and the n-channel type transistor Q12 are connected in series with the node N10 therebetween connected to the gate electrode of a third n-channel type transistor Q13. The other terminals of transistors Q11 and Q12 are connected to the signal line L15 for applying the R/W signal. The gate terminal of transistor Q11 is connected to the signal line L14, whereas the gate terminal of transistor Q12 is connected to data input line L11. One terminal of transistor Q13 is connected to the data output line L12 the other terminal of which is connected to the word selection signal line L13. In this manner, three transistors Q11, Q12 and Q13 form a parasitic or stray capacitance Co at their common node which can be used to store the data of one bit. In an actual circuitboard in addition to the parasitic capacitance there are many other capacitances, such as the gate capacitance of transistor Q13, the diffusion capacitance towards the source electrodes of transistors Q11 and Q12, and the distributed capacitance of the wiring conductors so that it should be understood that the capacitance Co also represents these stray capacitances.

Figure 3:
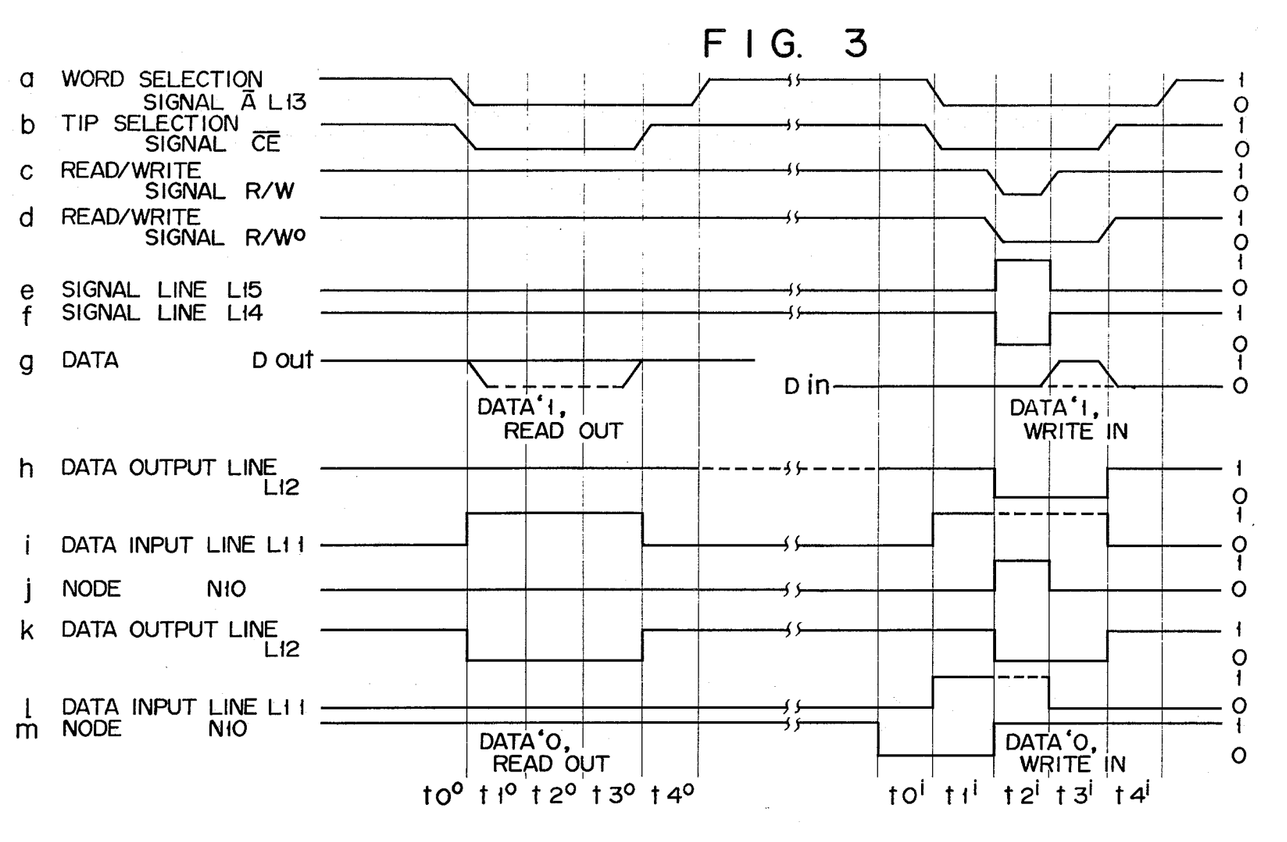
FIG. 3 is a time chart useful to explain the operation of the dynamic type semiconductor memory circuit shown in FIG. 1.

The write and read operations of the memory cell MC will be described with reference to FIG. 3. At first let us consider a case wherein various signals required by the dynamic type MOS-RAM shown in FIG. 1 have waveforms a through d as shown in FIG. 3. The waveform a shows a word selection signal A, and b a $\overline{CE}$ signal that designated a specific chip. When the signals $\overline{A}$ and $\overline{CE}$ both are a level "0", a data is written into or read out of a selected memory cell. The waveform c represents a read/write signal R/W. When the signal R/W is a level "1" a data is read out whereas a data is written in when the signal R/W is a level "0". The waveform d represents a read/write control signal $R/W^0$ for controlling the refresh circuit Rf comprising inverter circuits 11 and 12. Similar to the read/write signal R/W, a data is read out when the signal $R/W^0$ has a level "1" whereas a data is written in when the signal $R/W^0$ is a level "0". Simultaneously with the point of time when the signal R/W has a level "0" the signal $R/W^0$ also has a level "0" and again has a level "1" in synchronism with signal $\overline{CE}$. The waveform e and f show signals $CE \cdot A \cdot \overline{R/W}$ and $\overline{CE \cdot A \cdot R/W}$ flowing through read/write command signal lines L15 and L14, respectively and the waveform g shows the input data Din and the output data Dout to and from the data input-output lines L11 and L12, respectively. The lefthand half of the time chart shown in FIG. 3 shows waveforms of various signals at the time of data reading while the righthand half the waveforms of the signals at the time of writing. The portions of the waveform g shown by solid lines show respectively the output data and input data at the level "1" whereas the portions shown by dotted lines show respectively the output data and input data at the level "0".

With regard to the switching operation of the MOS type transistors, the p-channel MOS transistor turns OFF when its gate voltage is at "1" level and turns ON when its gate voltage is at "0" level. On the contrary, the n-channel MOS transistor turns ON when its gate voltage is at "1" level and turns OFF when its gate voltage is at "0" level.

In the time chart shown in FIG. 3, the read timings are designated by $t0^o$, $t1^o$, $t2^o$, $t3^o$ and $t4^o$. During the time interval $t0^o$, since signal $\overline{CE}$ is "1" and signal CE is "D" both transistors Q14 and Q15 turn ON. Accordingly, as shown by the waveforms h and i, the data output line L12 is precharged, while the data input line is discharged. During the time interval $t1^o$, the potential of the data output line L12 that has been charged will be held at "1" level as shown by the waveform h so long as transistor Q13 is at its OFF state. This "1" level potential is amplified and read out by a sense amplifier, not shown. However, if the transistor Q13 were ON, the data output line L12 would be connected to signal line L13 via transistor Q13 and the level of line L12 would be changed to "0". The ON and OFF states of transistor Q13 are determined by the state of storing data at the capacitance Co. Thus, when the node N10 is at "0" level as shown by an interval of $t1^o$-$t3^o$ of the waveform i the read out data is at "1" level, whereas when the node N10 is at "1" level as shown by an interval of $t1^o$-$t3^o$ of the waveform m, the read out data is at "0" level. At this time, transistors Q14 and Q15 are OFF, since the signals $\overline{CE}$ and CE are applied to their gate electrodes, so that the clocked inverter 12 operates to refresh the condition between data input and output lines L11 and L12. During the interval $t4^o$ the data input and output lines L11 and L12 are discharged and precharged respectively.

The writing operation will now be described with reference to the time chart shown in FIG. 3 between time intervals $t0^i$ and $t4^i$. During the time interval $t0^i$ the data output line L12 and the data input line L11 are precharged and discharged respectively, and in this interval the chip enabling signal CE is at "0" level, that is, the memory device including the given memory cell is not selected. During the intervals $t1^i$ through $t4^i$, the signal $\overline{A}$ on the word selection signal line L13 is at "0" level whereas the signal $\overline{CE}$ is at "0" level during only intervals $t1^i$, $t2^i$ and $t3^i$ thus specifying a given memory cell. During the interval $t1^i$ signal $CE \cdot R/W^0$ is at "1" level and signal $\overline{CE \cdot R/W^0}$ is at "0" level so that the refresh circuit operates to transfer the read out signal on the data output line L12 to the data input line L11. During the next interval $t2^i$, the states of the read/write command signal lines L14 and L15 are inverted to write modes thus turning ON transistor Q11 irrespective of the ON and OFF states of transistor Q12. At this time, since the state of the signal line L15 is inverted to "1" level, the node N10 becomes "1" level. The R/W signal becomes "1" level that is, read mode during the next interval $t3^i$ but since the R/W⁰ signal is continuously supplied at "0" level, when the input data $Din$ from the sense amplifier is written at "0" level, the " " level data input signal transmitted to the data input line L11 and the reinverted signals on read/write command signal lines L14 and L15 turn OFF both transistors Q11 and Q12. Consequently, capacitance Co is not discharged so that the potential of the node N10 is maintained at "1" level. When the input data $Din$ is at "1" level, transistor Q11 turns OFF and transistor Q12 turns ON so that the capacitance Co is discharged through transistor Q12 to the read/write command signal line L15 which has been inverted to "0" level. On other words, the "1" level signal on the data input line L11 is inverted and written in the capacitance Co at the node as a "0" level potential. During the interval $t4^i$, the data input line L11 is charged to a potential of $+V_D$ through the p-channel transistor Q15 which has been turned ON by signal CE, whereas the data output line L12 is grounded through the n-channel transistor Q14 which has been turned ON by signal $\overline{CE}$. In this manner, it is possible to read at any time the data written in capacitance Co by the precharge and discharge thereof. The time interval $t4^i$ corresponds to the time interval $t0^o$.

Although the operation of the memory cell of the memory device shown in FIG. 1 has been described with reference to waveform diagrams shown in FIG. 3, it should be understood that the operation of the memory cell differs dependent upon the construction of peripheral circuits, and the waveforms of the signals.

Figure 4:
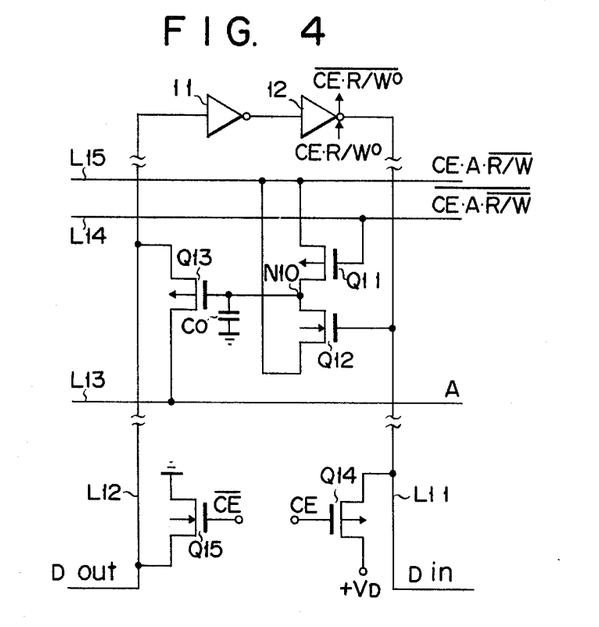
FIGS. 4, 5 and 6 are connection diagrams showing modifications of the dynamic type semiconductor memory device shown in FIG. 1.
Figure 5:
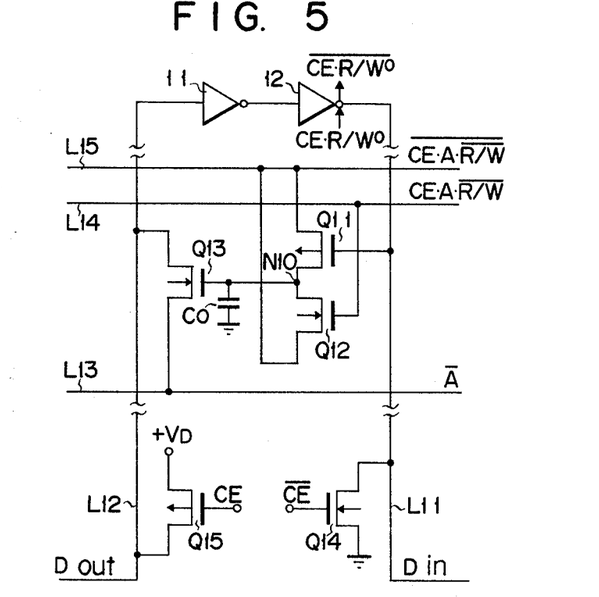
Figure 6:
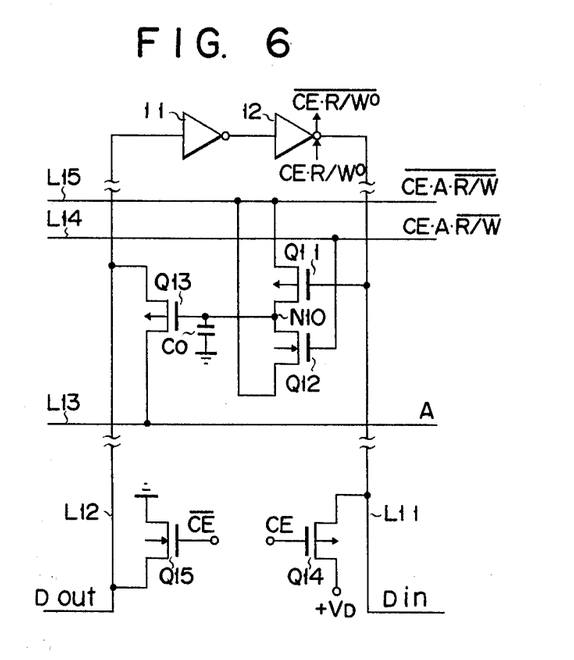

FIGS. 4, 5 and 6 show modifications of the embodiment shown in FIG. 1, in which elements corresponding to those of FIG. 1 are designated by the same reference characters.

In the modification shown in FIG. 4, the memory cell MC is constituted by a pair of serially connected complementary MOS transistors Q11 and Q12 with gate electrodes respectively connected to signal line L14 and data input line L11, a p-channel MOS transistor Q13 having its gate electrode connected to the node between transistors Q11 and Q12. Data input and output lines L11 and L12 are connected to a point at positive potential and a point at the ground potential through transistors Q14 and Q15 respectively.

In the modification shown in FIG. 5, the gate electrodes of the complementary transistors Q11 and Q12 of the memory cell MC are connected to the data input line L11 and the signal line L14 respectively. Transistor Q13 comprises an n-channel MOS transistor. The data input and output lines L11 and L12 are connected to a point at the ground potential and a point at a positive potential respectively, through transistors Q14 and Q15.

In the modification shown in FIG. 6, the connections of the gate electrodes of transistors Q11 and Q12 are the same as in the modification shown in FIG. 5, but transistor Q13 is constituted by a p-channel MOS transistor and the data input and output lines L11 and L12 and charged oppositely to those of the embodiment shown in FIG. 5.

Figure 7:
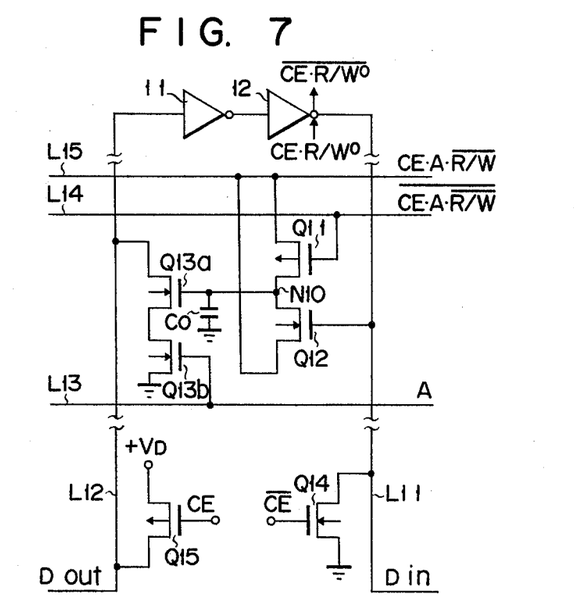
FIG. 7 is a connection diagram showing another embodiment of the dynamic type semiconductor memory device in which a data output line is grounded via two transistors.

In the embodiment shown in FIG. 7, the memory cell MC comprises a pair of serially connected complementary transistors Q11 and Q12 with their gate electrodes connected to the signal line L14 and the date input line L11 respectively, and a pair of n-channel MOS transistors Q13a and Q13b which are connected in series between the data output line L12 and a point at the ground potential and having gate electrodes respectively connected to the mode N10 between transistors Q11 and Q12 and the word selection line L13. Data input and output lines L11 and L12 are connected to the point at the ground potential and a source of positive potential $+V_D$ respectively through transistors Q14 and Q15.

Figure 8:
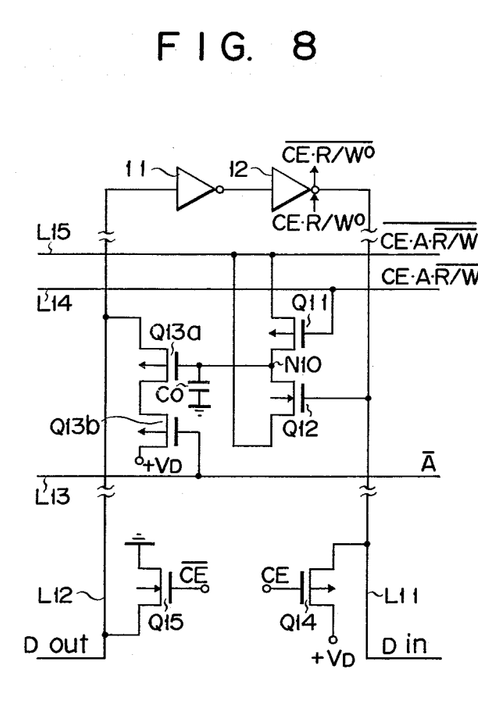
FIGS. 8, 9 and 10 show modifications of the memory device shown in FIG. 7.
Figure 9:
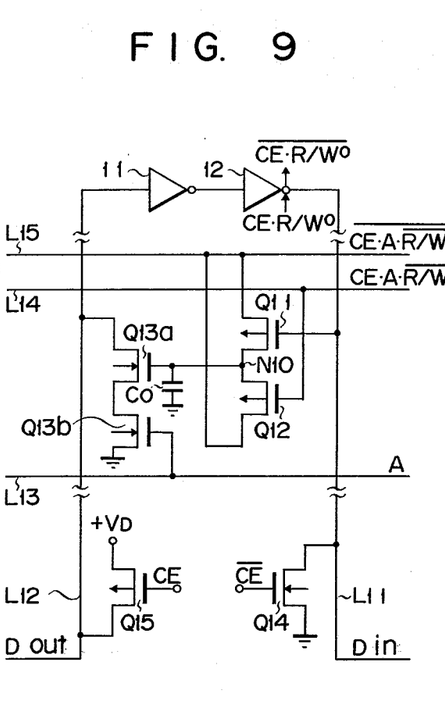
Figure 10:
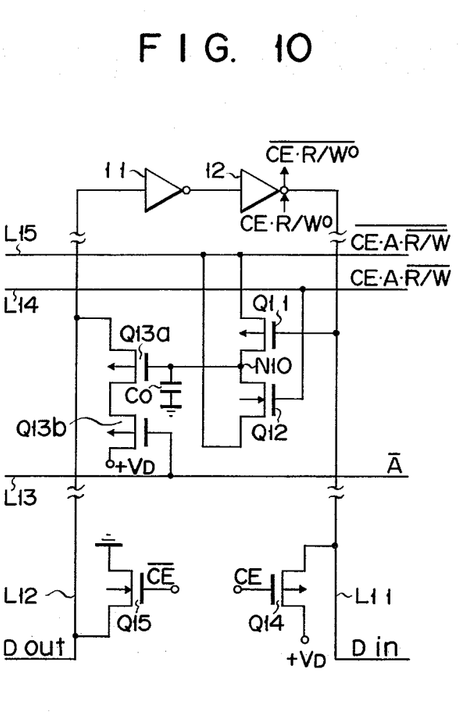

FIGS. 8, 9 and 10 show modifications of the embodiment shown in FIG. 7.

In the modification shown in FIG. 8, transistors Q13a and Q13b comprises p-channel MOS transistors and the data input and output lines L11 and L12 are connected to the source of positive potential $+V_D$ and the point at the ground potential, respectively, through transistors Q14 and Q15.

The modification shown in FIG. 9 is identical to that shown in FIG. 7, except that the gate electrodes of transistors Q11 and Q12 are connected to the signal line L11 and the data input line L14, respectively.

The modification shown in FIG. 10 is identical to that shown in FIG. 8 except that the gate electrodes of transistors Q11 and Q12 are connected to the data input line L11 and the signal line L14 respectively.

As has been described hereinabove the invention provides a dynamic type semiconductor memory device including a complementary type transistor circuit capable of increasing the memory capacity as well as the density of the integrated circuits on a chip and can decrease the power consumption. The accuracy of the operation is also improved and the advantage of the complemetary type circuit is fully utilized. Although in the embodiments described above, a positive logic wherein a positive potential (high potential) is a logic "1" and a ground potential (low potential) is a logic "0" was used it will be clear that a negative logic wherein a ground potential (high potential) is a logic "0" and a negative potential (low potential) is a logic "1" can also be used.

What we claim is:

1. A dynamic type semiconductor memory device comprising a refresh circuit, a plurality of semiconductor memory cells which are connected across a data input line and a data output line, a plurality of read/write command signal line and a plurality of word selection lines which are provided for each of said semiconductor memory cells, each of said semiconductor memory cells comprises serially connected first and second transistors of the opposite polarity, the gate electrodes of said first and second transistors being connected to said read/write command signal line and said data input line, respectively, a third transistor connected across said data output line and said word selection line, the gate electrode of said third transistor being connected to the node between said first and second transistors, and a parasitic capacitance formed at the common node between said first, second and third transistors for storing data.

2. A dynamic type semiconductor memory device comprising a refresh circuit connected across a data input line and a data output line; a plurality of semiconductor memory cells connected across said data input line and said data output line; a plurality of read/write command signal lines and a plurality of word selection lines for respective semiconductor memory cells; and address gate circuit connected across said data input line and said data output line; each of said semiconductor memory cells comprising serially connected first and second transistors of the opposite polarity, the gate electrodes of said first and second transistors being connected to said read/write command signal line and said data input line respectively, a third transistors connected across the data output line and said word selection line and having a gate electrode connected to the node between said first and second transistors, and a parasitic capacitance formed at the common node between said first, second and third transistors for storing data.

3. The dynamic type semiconductor memory device according to claim 2 wherein said address gate circuit comprises a p-channel MOS transistor connected between said data output line a point charged at a first potential and an n-channel MOS transistor connected between said data input line and a point charged at a second potential, said first and second transistors of said semiconductor memory cells are constituted by a p-channel MOS transistor and an n-channel MOS transistor respectively, and said third transistor comprises an n-channel MOS transistor.

4. The dynamic type semiconductor memory device according to claim 2 wherein said address gate circuit comprises a p-channel MOS transistor connected between said data input line and a point charged at a first potential and an n-channel MOS transistor connected between said data output line and a point charged at a second potential, said first and second transistors of said semiconductor memory cells are constituted by a p-channel MOS transistor and an n-channel MOS transistor respectively, and said third transistor comprises a p-channel MOS transistor.

5. A dynamic type semiconductor memory device comprising a refresh circuit, a plurality of semiconductor memory cells, and an address gate circuit which are respectively connected across a data input line and a data output line, and a plurality of read/write command signal lines and a plurality of word selection lines which are provided for respective semiconductor memory cells, each of said semiconductor memory cells comprising serially connected first and second transistors of the opposite polarity, the gate electrodes of said first and second transistors being connected to said read/write command signal line and said data input line respectively, third and fourth transistors which are connected in series between said data output line and a point charged at a definite potential, the gate electrodes of said third and fourth transistors being connected to the node between said first and second transistors and said word selection line respectively, and a parasitic capacitance formed at the node between said first and second transistors for storing data.

6. The dynamic type semiconductor memory device according to claim 5 wherein said address gate circuit comprises an n-channel MOS transistor connected between said data input line and a point charged at a second potential and a p-channel transistor connected between said data output line and a point charged at a first potential, the first and second transistors of said semiconductor cells are constituted by a p-channel MOS transistor and an n-channel MOS transistor respectively, and said third and fourth transistors of said semiconductor memory cells are constituted by n-channel MOS transistors respectively.

7. The dynamic type semiconductor memory device according to claim 5 wherein said address gate circuit comprises a p-channel MOS transistor connected between said data input line and a point charged at a first potential, and an n-channel MOS transistor connected between said data output line and a point charged at a second potential, said first and second transistors of said semiconductor memory cells comprise a p-channel MOS transistor and an n-channel MOS transistor respectively, said third and fourth transistors of said memory cells are constituted by p-channel MOS transistors respectively.

8. A dynamic type semiconductor memory device comprising a refresh circuit connected between a data input line and a data output line; a plurality of semiconductor memory cells connected between said data input and output lines; a plurality of read/write command signal lines and a plurality of word selection lines provided for respective semiconductor memory cells; and an address gate circuit connected between said data input line and said data output line; each of said semiconductor memory cells comprises serially connected first and second transistors of the opposite polarity the gate electrodes of which are connected to said data input line and said read/write command signal line respectively, a third transistor connected between said data output line and said word selection line, the gate electrode of said third transistor being connected to the node between said first and second transistors, and a parasitic capacitance connected to the common node between said first, second and third transistor for storing data.

9. The dynamic type semiconductor memory device according to claim 8 wherein said address gate circuit comprises a p-channel MOS transistor connected between said data output line and a point charged at a first potential, and an n-channel MOS transistor connected between said data input line and a point charged at a second potential, the first and second transistors of said semiconductor memory cell are constituted by a p-channel MOS transistor and an n-channel MOS transistor respectively, and said third transistor of said semiconductor memory cell is constituted by an n-channel MOS transistor.

10. The dynamic type semiconductor memory device according to claim 8 wherein said address gate circuit comprises a p-channel MOS transistor connected between said data input line and a point charged at a first potential, and an n-channel MOS transistor connected between said data output conductor and a point charged at a second potential, the first and second transistors of said semiconductor memory cells are constituted by a p-channel MOS transistor and an n-channel MOS transistor respectively, and the third transistor of said semiconductor memory cell is constituted by a p-channel MOS transistor.

11. A dynamic type semiconductor memory device comprising a refresh circuit, a plurality of semiconductor memory cells and an address gate circuit which are connected between a data input line and a data output line, a plurality of read/write command signal lines, and a plurality of word selection lines, said read/write command signal lines and word selection lines provided for respective semiconductor memory cells, each of said semiconductor memory cells comprising serially connected first and second transistors of the opposite polarity, the gate electrodes of said first and second transistors being connected to said data input line and said read/write command signal line respectively, third and fourth transistors which are connected in series between said data output line and a point charged at a predetermined potential, the gate electrodes of said third and fourth transistors being connected to the node between said first and second transistors and said word selection line respectively, and a parasitic capacitance formed at the node between said first and second transistors for storing data.

12. The dynamic type semiconductor memory device according to claim 11 wherein said address gate circuit comprises a p-channel transistor connected between said data output line and a point charged at a first potential, an n-channel MOS transistor connected between said data input line and a point charged at a second potential, the first and second transistors of said semiconductor memory cells are constituted by a p-channel MOS transistor and an n-channel MOS transistor respectively, and the third and fourth transistors of said semiconductor memory cells are constituted by n-channel MOS transistors respectively.

13. The dynamic type semiconductor memory device according to claim 11 wherein said address gate circuit comprises a p-channel MOS transistor connected between said data input line and a point charged at a first potential, and an n-channel MOS transistor connected between said data output line and a point charged at a second potential, the first and second transistors of said semiconductor memory cells are constituted by a p-channel MOS transistor and an n-channel MOS transistor respectively, and the third and fourth transistors of said semiconductor memory cells are constituted by p-channel MOS transistors respectively.

* * * * *